United States Patent
Wu et al.

(10) Patent No.: US 7,414,289 B2
(45) Date of Patent: Aug. 19, 2008

(54) SOI DEVICE WITH CHARGING PROTECTION AND METHODS OF MAKING SAME

(75) Inventors: David D. Wu, Austin, TX (US); Jingrong Zhou, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 139 days.

(21) Appl. No.: 11/457,927

(22) Filed: Jul. 17, 2006

(65) Prior Publication Data

US 2008/0012072 A1 Jan. 17, 2008

(51) Int. Cl.
H01L 27/01 (2006.01)
(52) U.S. Cl. .................... 257/347; 257/349
(58) Field of Classification Search .......... 257/347, 257/349
See application file for complete search history.

(56) References Cited

U.S. PATENT DOCUMENTS

| | | | | |
|---|---|---|---|---|
| 5,023,201 A | 6/1991 | Stanasolovich et al. | ..... | 437/192 |
| 5,314,841 A | 5/1994 | Brady et al. | ..... | 437/203 |
| 6,204,196 B1 | 3/2001 | Sandhu et al. | ..... | 438/760 |
| 6,300,666 B1 | 10/2001 | Fechner et al. | ..... | 257/503 |
| 6,358,782 B1 * | 3/2002 | Masuda | ..... | 438/149 |
| 7,115,964 B2 * | 10/2006 | Mori | ..... | 257/508 |
| 2001/0010964 A1 | 8/2001 | Geissler et al. | ..... | 438/381 |
| 2004/0217421 A1 | 11/2004 | Aminpur et al. | ..... | 257/347 |
| 2004/0241917 A1 | 12/2004 | Schwan et al. | ..... | 438/151 |

FOREIGN PATENT DOCUMENTS

| | | |
|---|---|---|
| GB | 2346260 A | 8/2000 |
| WO | WO02/073667 A1 | 9/2002 |

* cited by examiner

*Primary Examiner*—Mark Prenty
(74) *Attorney, Agent, or Firm*—Williams, Morgan & Amerson, P.C.

(57) ABSTRACT

The present invention is directed to an SOI device with charging protection and methods of making the same. In one illustrative embodiment, a device is formed on an SOI substrate including a bulk substrate, a buried insulation layer and an active layer. The device includes a transistor formed in an isolated portion of the active layer, the transistor including a gate electrode and a source region. The device further includes a first conductive bulk substrate contact extending through the active layer and the buried insulation layer, the first conductive bulk substrate contact being conductively coupled to the source region and the bulk substrate, and a second conductive bulk substrate contact extending through the active layer and the buried insulation layer, the second conductive bulk substrate being conductively coupled to the gate electrode and the bulk substrate.

30 Claims, 9 Drawing Sheets

SOI DEVICE WITH CHARGING PROTECTION AND METHODS OF MAKING SAME

BACKGROUND OF THE INVENTION

1. Field of the Invention

The present invention is generally directed to the field of semiconductor devices, and, more particularly, to an SOI device with charging protection and methods of making same.

2. Description of the Related Art

In modern integrated circuits, the number and density of individual circuit elements, such as field effect transistors, is steadily increasing and, as a consequence, performance of these integrated circuits is currently improving. The increase in package density and signal performance of integrated circuits requires the reduction of critical feature sizes, such as the gate length and the channel length of field effect transistors, to minimize the chip area occupied by a single circuit element and to reduce signal propagation delay resulting from a delayed channel formation. However, currently critical feature sizes are approaching 0.1 µm and less and a further improvement in circuit performance by reducing the sizes of the transistor elements is partially offset by parasitic capacitances of the transistors formed in bulk silicon substrates.

To meet the ever-increasing demands with respect to device and circuit performance, circuit designers have proposed new device architectures. One technique to improve performance of a circuit, for example of a CMOS device, is to manufacture the circuit on a so-called silicon-on-insulator (SOI) substrate. An SOI substrate comprises an insulating layer formed on a bulk substrate, for example, a silicon substrate or glass substrate, wherein the insulating layer frequently comprises silicon dioxide and is sometimes referred to as buried oxide layer or "box" layer. Subsequently, an active silicon layer is formed on the insulating layer in which an active region for a field effect transistor device is defined by shallow trench isolation structures. A correspondingly fabricated transistor is entirely electrically isolated from the regions surrounding the transistor area. Contrary to a conventional device formed on a bulk semiconductor substrate, the isolation of the active region of the SOI device significantly suppresses parasitic effects known from conventional devices, such as latch-up and leakage currents drifting into the substrate. SOI devices are also characterized by lower parasitic capacitances compared to devices formed on a bulk semiconductor substrate and, hence, exhibit an improved high-frequency performance. Moreover, due to the significantly reduced volume of the active region, radiation-induced charge carrier generation is also remarkably reduced and renders SOI devices extremely suitable for applications in radiation-intensive environments.

However, it is also well known that, during operation, undesirable charges may accumulate below the channel region of the transistor, thereby adversely affecting the transistor characteristics, such as the threshold voltage, single-transistor-latch-up, and the like.

Furthermore, undesirable charge damage on devices may also occur during the course of fabricating such SOI structures. For example, the use of plasma-based etching processes may result in undesirable charge damage to components of the SOI device, such as the gate insulation layer.

The present invention is directed to eliminating or at least reducing the problem of undesirable charge damage during the manufacturing of SOI devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to an SOI device with charging protection and methods of making same. In one illustrative embodiment, a device is formed on an SOI substrate comprising a bulk substrate, a buried insulation layer and an active layer. The device comprises a transistor formed in an isolated portion of the active layer, the transistor including a gate electrode and a source region. The device further comprises a first conductive bulk substrate contact extending through the active layer and the buried insulation layer, the first conductive bulk substrate contact being conductively coupled to the source region and the bulk substrate, and a second conductive bulk substrate contact extending through the active layer and the buried insulation layer, the second conductive bulk substrate being conductively coupled to the gate electrode and the bulk substrate.

In another illustrative embodiment, a device is formed on an SOI substrate comprising a bulk substrate, a buried insulation layer and an active layer. The device comprises a transistor formed in an isolated portion of the active layer, the transistor comprising a gate electrode and a source region. The device further comprises a first conductive bulk substrate contact extending through the active layer and the buried insulation layer, the first conductive bulk substrate contact being conductively coupled to the bulk substrate, a first conductive flow path that conductively couples the first bulk substrate contact to the source region, a second conductive bulk substrate contact extending through the active layer and the buried insulation layer, the second conductive bulk substrate being conductively coupled to the bulk substrate, and a second conductive flow path that conductively couples the second bulk substrate contact to the gate electrode, wherein the first and second conductive flow paths are electrically isolated from one another.

BRIEF DESCRIPTION OF THE DRAWINGS

The invention may be understood by reference to the following description taken in conjunction with the accompanying drawings, in which like reference numerals identify like elements, and in which.

Figure 1:
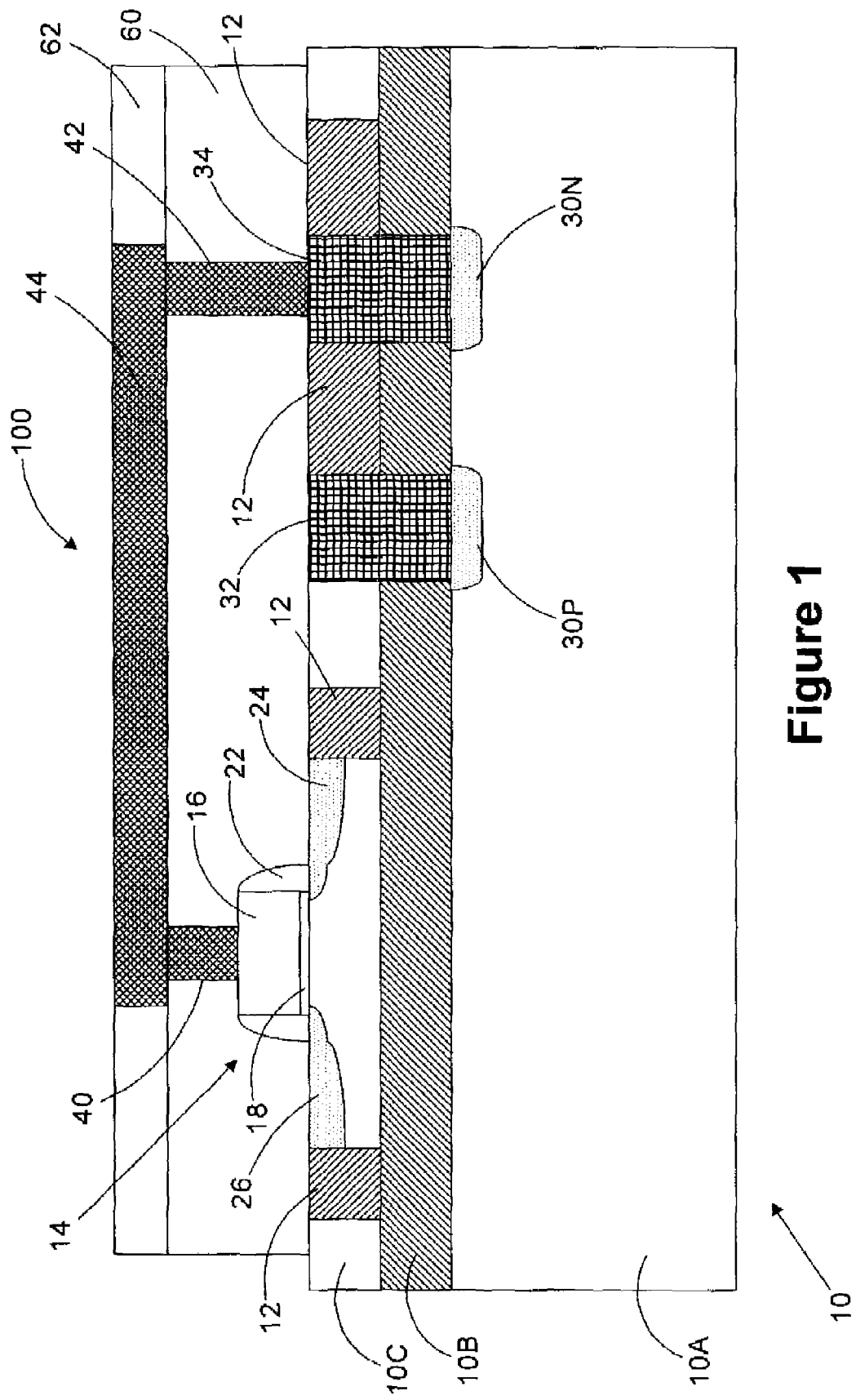
FIGS. 1, 1A and 2 are cross-sectional views of an illustrative embodiment of a semiconductor device in accordance with one illustrative aspect of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
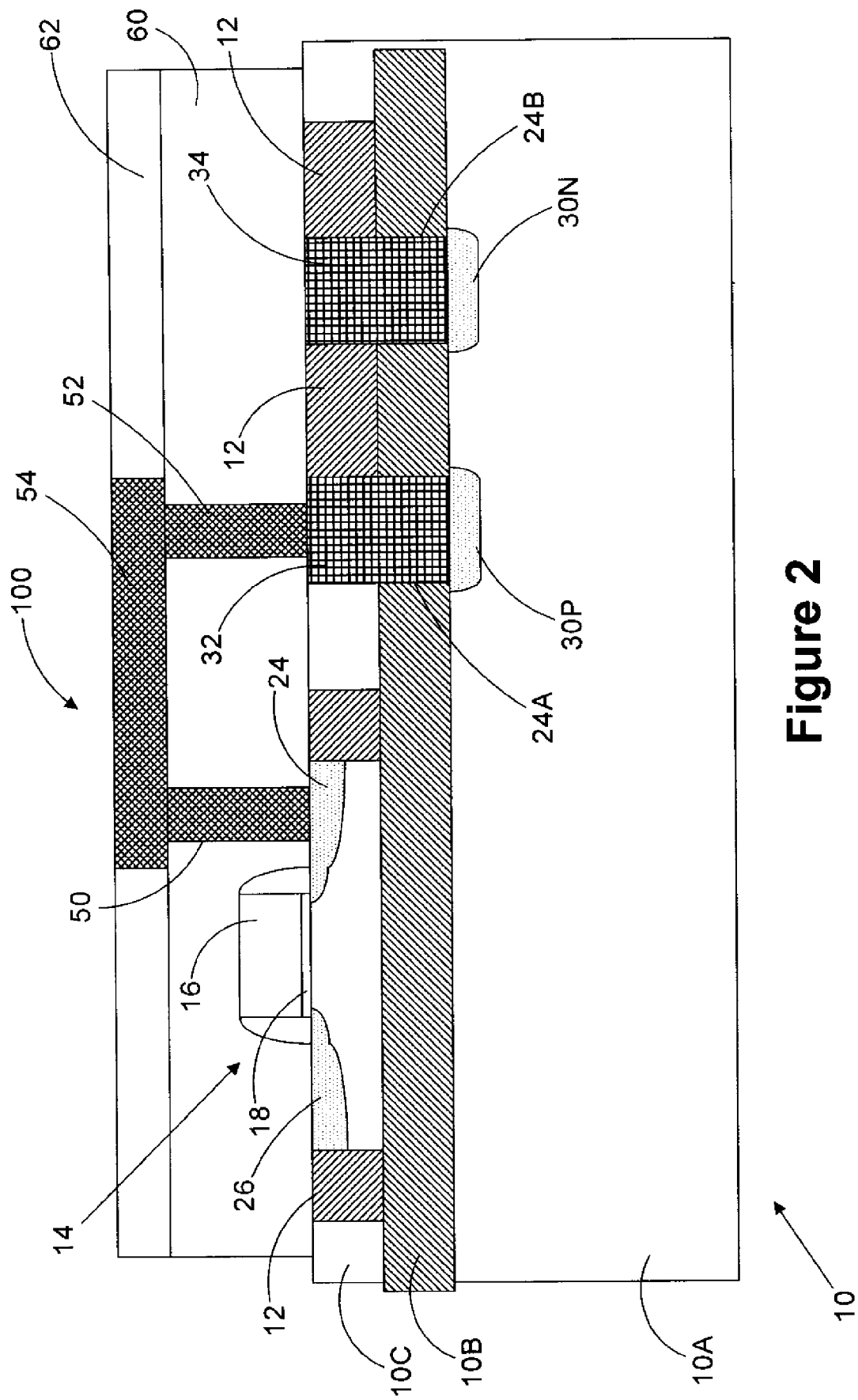

In general, the present invention is directed to an SOI semiconductor device with means for preventing or reducing antenna charging in the device. FIGS. 1 and 2 are cross-sectional views of an illustrative semiconductor device 100 in accordance with one aspect of the present invention. As shown therein, an illustrative transistor 14 is formed above an SOI substrate 10 comprising a bulk semiconductor substrate 10A, a buried insulation layer 10B (sometimes referred to as a "box" layer) and an active layer 10C. The SOI substrate 10 may be formed using a variety of known techniques and it may be comprised of a variety of materials. In one illustrative embodiment, the bulk substrate 10A is comprised of silicon, the buried insulation layer 10B is comprised of silicon dioxide, and the active layer 10C is comprised of silicon. The bulk substrate 10A may be doped with either a P-type or N-type dopant material. In the illustrative embodiment described herein, the bulk substrate 10A is doped with a P-type dopant material. After a complete reading of the present application, those skilled in the art will readily understand that the present invention may be employed in forming a variety of semiconductor devices above an SOI substrate comprised of a variety of different materials. Thus, the present invention should not be considered as limited to the illustrative embodiments disclosed herein.

The device 100 further comprises a plurality of trench isolation regions 12 formed in the active layer 10C. The transistor 14 is formed in an isolated portion of the active layer 10C. The transistor 14 is generally comprised of a gate electrode 16, a gate insulation layer 18, a sidewall spacer 22, a source region 24 and a drain region 26. The transistor 14 may be either an NMOS or PMOS transistor. In the illustrative embodiment described herein, the transistor 14 is an NMOS transistor, although the present invention is not limited to such a device. In an NMOS device, the area of the active layer 10C in which the transistor 100 is formed will typically be doped with a P-type dopant material, while the source and drain regions 24, 26 will typically be doped with an N-type dopant material. For a PMOS device, the active layer 10C will be doped with an N-type dopant material, while the source and drain regions 24, 26 will be doped with a P-type dopant material.

Figure 1A:
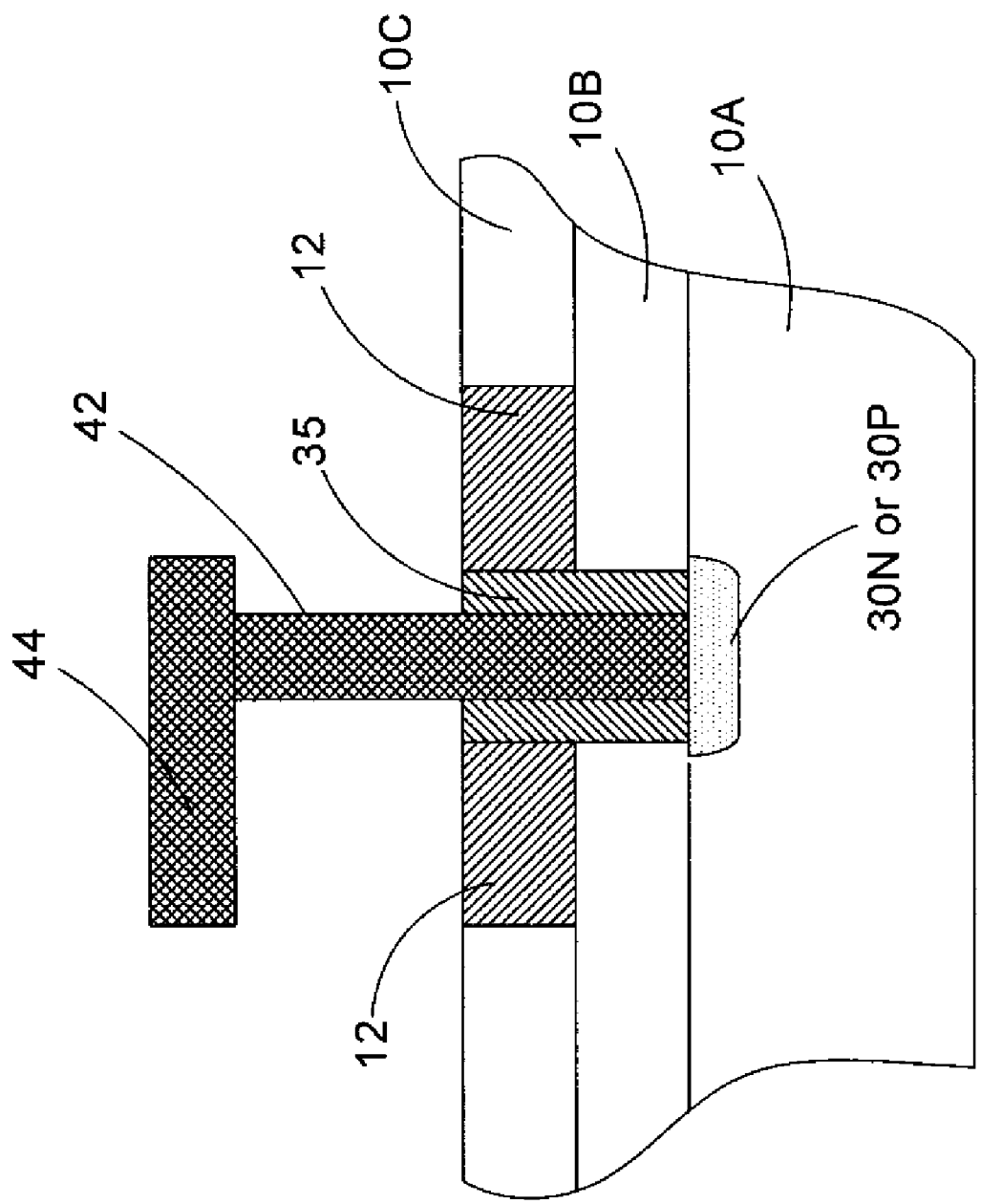

Also depicted in FIGS. 1 and 2 are bulk substrate contacts 32 and 34 which are conductively coupled to the bulk substrate 10A. More specifically, the bulk substrate contacts 32, 34 contact doped regions 30P, 30N, respectively, formed in the bulk substrate 10A. FIG. 1 depicts conductive contacts 40, 42 and a conductive line 44 that provide a conductive electrical path between the gate electrode 16 and the bulk substrate contact 34. FIG. 2 depicts contacts 50, 52 and conductive line 54 that provide a conductive path between the source region 24 of the transistor 14 and the bulk substrate contact 32. In both cases, the conductive contacts and metal lines are formed in layers of insulating material 60, 62. The conductive path established between the gate electrode 16 and the substrate contact 34 is electrically isolated from the conductive path established between the source region 24 and the bulk substrate contact 32. Additionally, although a single contact is depicted to the gate electrode 16, the source region 24 and the bulk substrate contacts 32, 34, multiple conductive connections may be established to each of these regions if needed or desired. FIG. 1A depicts an alternative embodiment wherein the conductive contact 42 extends through insulating material 35 to contact the doped region 30N or 30P, depending on the particular application.

Figure 3:
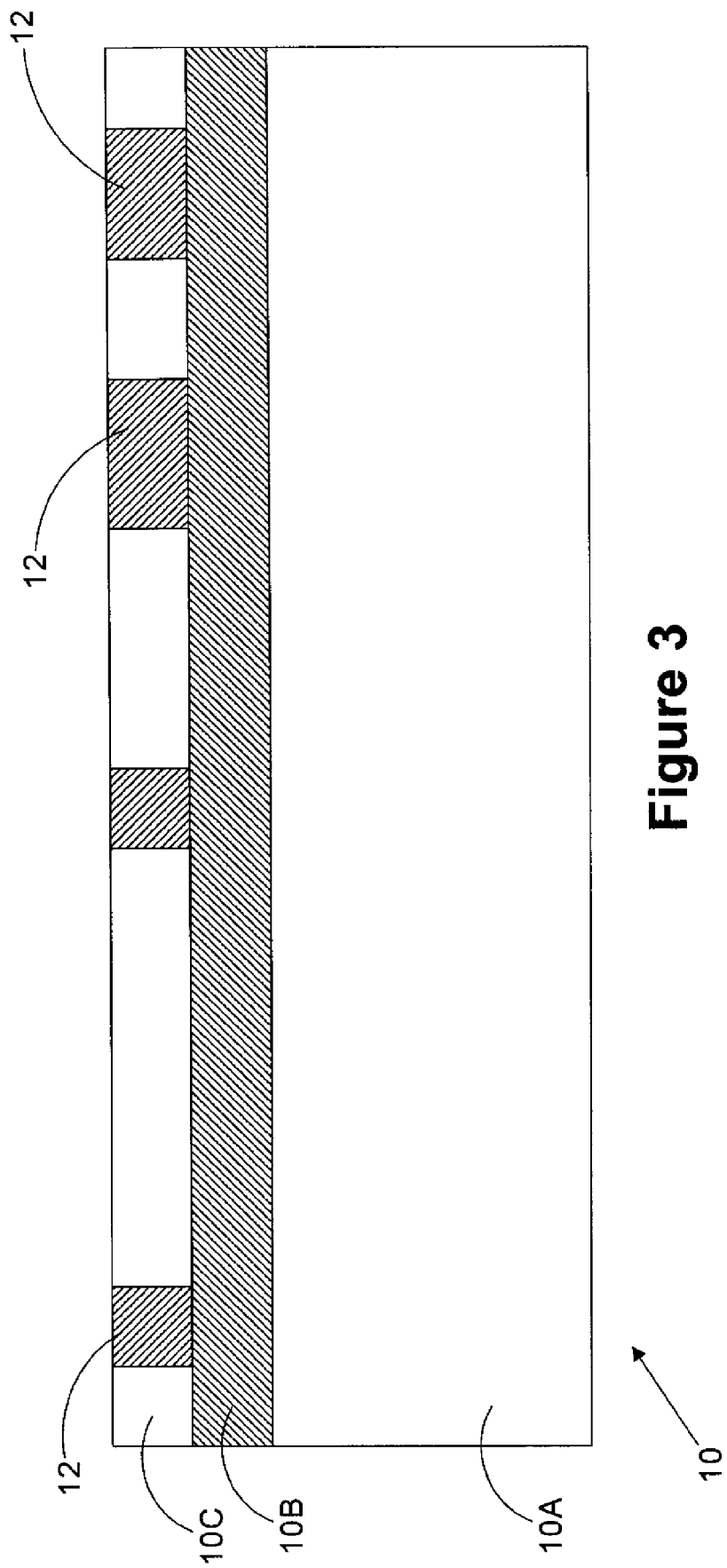
FIGS. 3-8 depict portions of an illustrative process flow that may be employed in forming the illustrative embodiment depicted herein.

FIGS. 3-8 depict a portion of an illustrative process flow that may be used to form the device 100 depicted in FIGS. 1 and 2. Initially, as shown in FIG. 3, trench isolation structures 12 are formed in the active layer 10C by performing known etching, deposition and polishing techniques. The size and arrangement of the isolation structures 12 may vary depending upon the particular application. In one illustrative embodiment, the isolation structures 12 are filled with an insulating material such as silicon dioxide.

Figure 4:
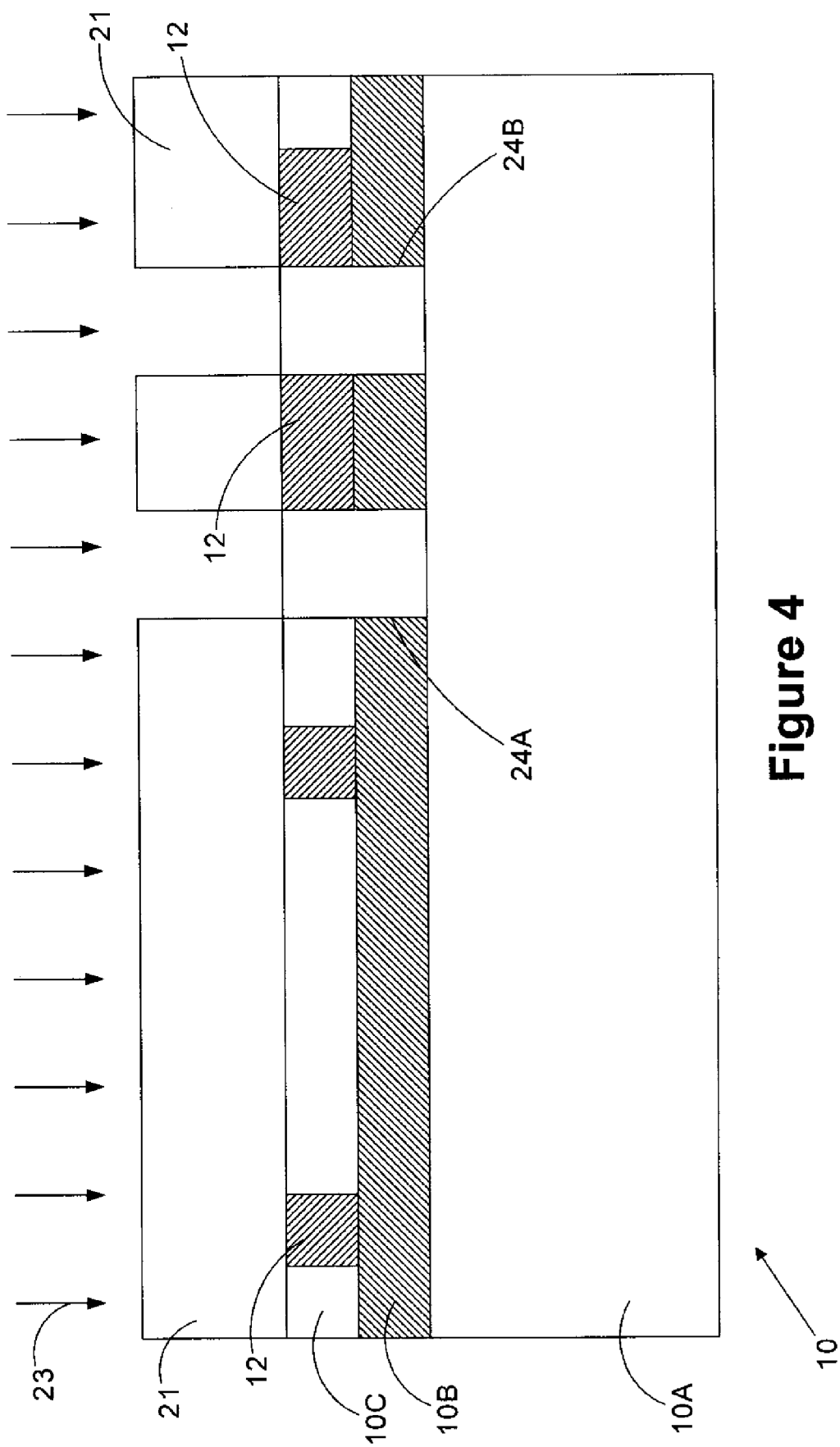

Next, as shown in FIG. 4, a first patterned masking layer 21, e.g., a patterned layer of photoresist, is formed above the SOI substrate 10. An etching process 23 is performed to form openings 24A, 24B. The openings 24A, 24B extend through the active layer 10C and the buried insulation layer 10B and expose a surface of the bulk substrate 10A. In some embodiments, the openings 24A, 24B may extend into and penetrate the surface of the bulk substrate 10A. Any of a variety of known etching processes, e.g., an anisotropic etching process, may be performed to define the openings 24A, 24B with appropriate changes, if necessary, in the etch chemistry. The size and shape of the openings 24A, 24B may vary depending upon the particular application, and they may not each have the same size and configuration. In one illustrative embodiment, the openings 24A, 24B are generally circular openings having a diameter of approximately 0.2 µm. Of course, these dimensions and shapes may change depending upon a particular application.

Figure 5:
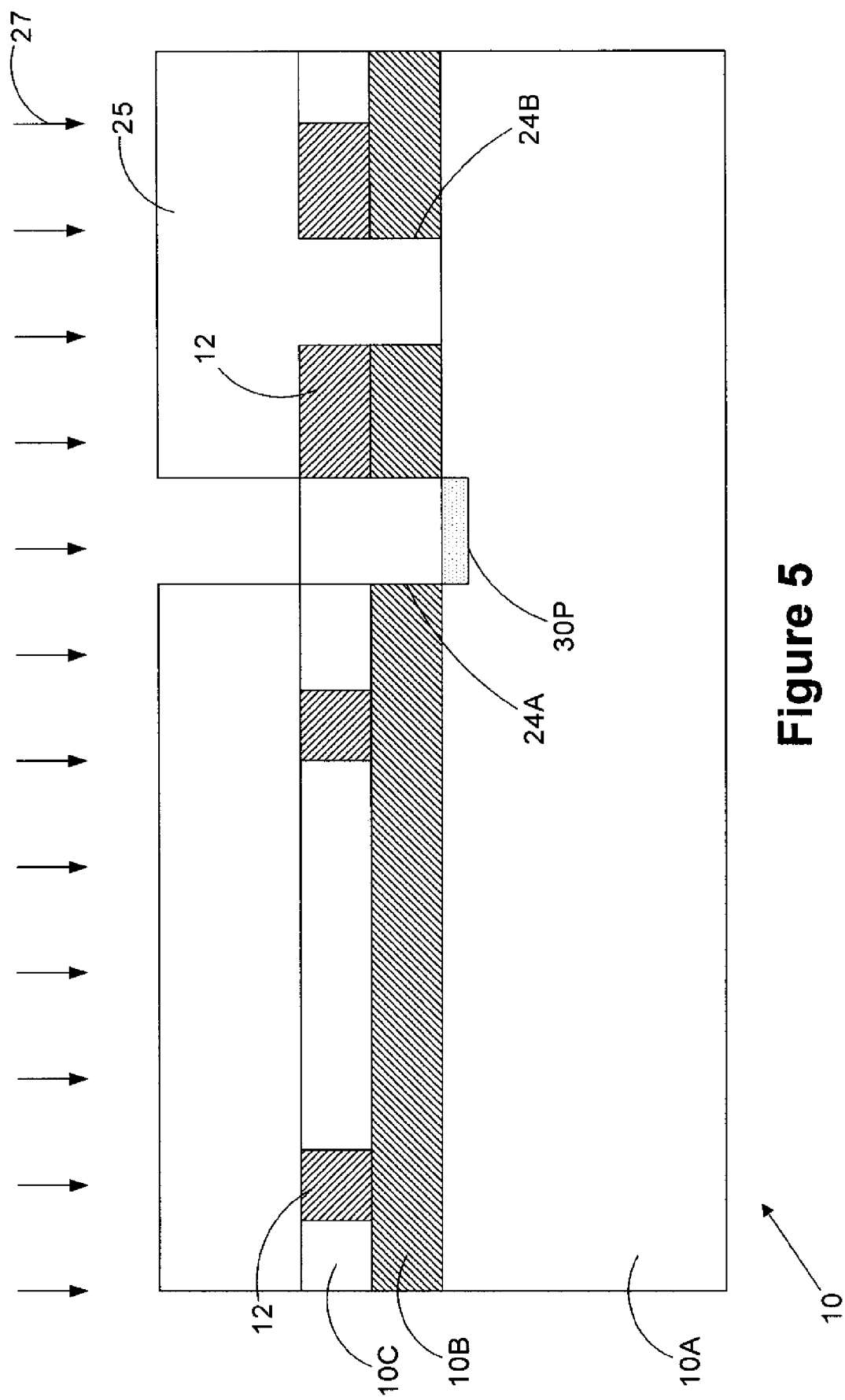

Next, as shown in FIG. 5, the first patterned masking layer 21 is removed and a second patterned masking layer 25, e.g., photoresist, is formed above the substrate 10. An ion implantation process 27 is performed to introduce a P-type dopant material into the bulk substrate 10A through the opening 24A to thereby define P-doped region 30P in the bulk substrate 10A. The parameters of the ion implantation process 27 may vary depending upon the particular application. In one illustrative embodiment, the ion implantation process 27 is performed using boron at a dopant dose of approximately $10^{14}$-$10^{15}$ ions/cm$^2$ and at an energy level of approximately 20-50 keV. The masking layer 25 serves to protect portions of the device 100 where P-type dopant materials are not desired to be implanted. Of course, the formation of the P-doped region 30P may be performed at any time during the formation of the transistor 100 that is convenient. For example, the P-doped region 30P may be performed at the same time P-type dopant materials are implanted into the active layer 10C.

Figure 6:
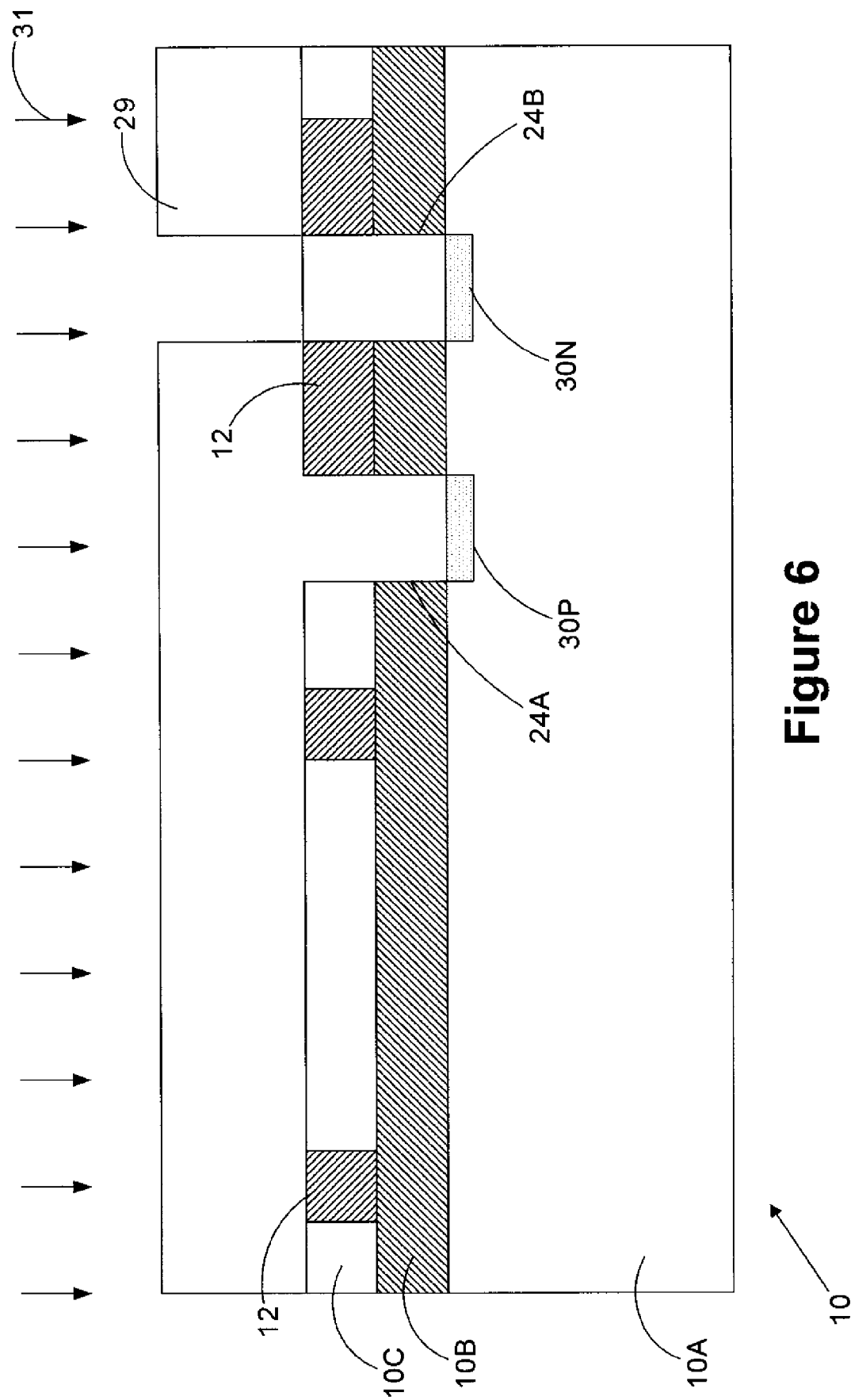

Next, as shown in FIG. 6, the second masking layer 25 is removed and a third masking layer 29 is formed to expose the opening 24B. An ion implantation process 31 is performed to introduce N-type dopant materials into the bulk substrate 10A to thereby form N-doped region 30N. The parameters of the ion implantation process 31 may vary depending upon the particular application. In one illustrative embodiment, the ion implantation process 31 is performed using arsenic at a dopant dose of approximately $10^{14}$-$10^{15}$ ions/cm$^2$ and at an energy level of approximately 30-70 keV. The masking layer 29 serves to protect portions of the device 100 where N-type dopant materials are not desired to be implanted. Of course, the N-doped region 30N may be formed at any time that is convenient. For example, in the case of an NMOS device, the N-doped region 30N may be formed at the same time dopant materials are implanted to form a portion of the source/drain regions 24, 26.

Figure 7:
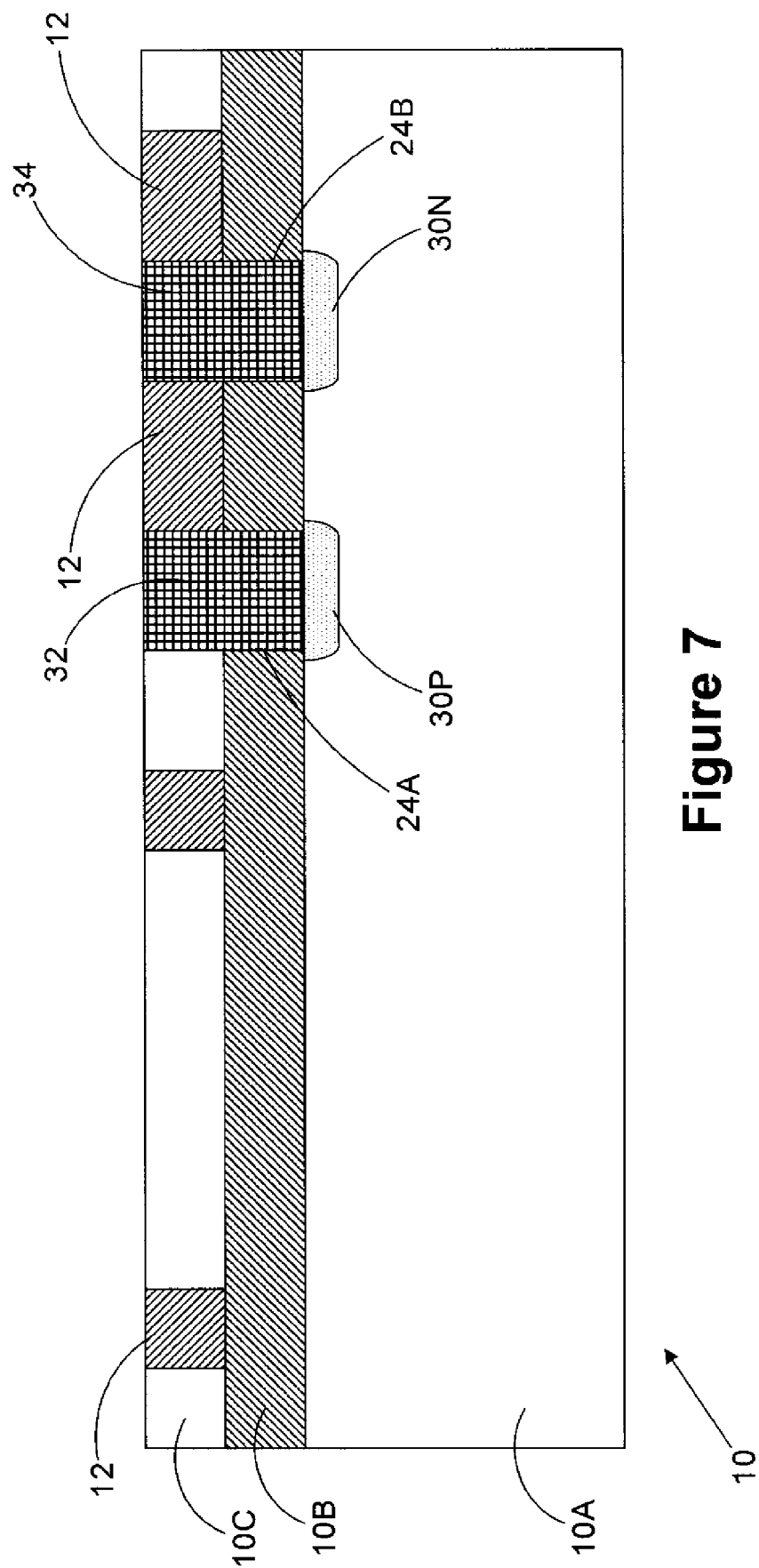

Thereafter, as shown in FIG. 7, conductive bulk substrate contacts 32, 34 are formed in the openings 24A, 24B, respectively, using a variety of known techniques. Also note that the doped regions 30P, 30N are depicted as having migrated somewhat due to various processing that may have occurred from the time of initial implantation. The conductive bulk substrate contacts 32, 34 may be comprised of a variety of different materials, and they may not be comprised of the same material. For example, the conductive bulk substrate contacts 32, 34 may be comprised of tungsten, polysilicon, etc. The bulk substrate contacts 32, 34 may be formed by performing a variety of known deposition techniques, e.g., sputter deposition, and thereafter performing a chemical mechanical polishing process to remove excess metal.

Figure 8:
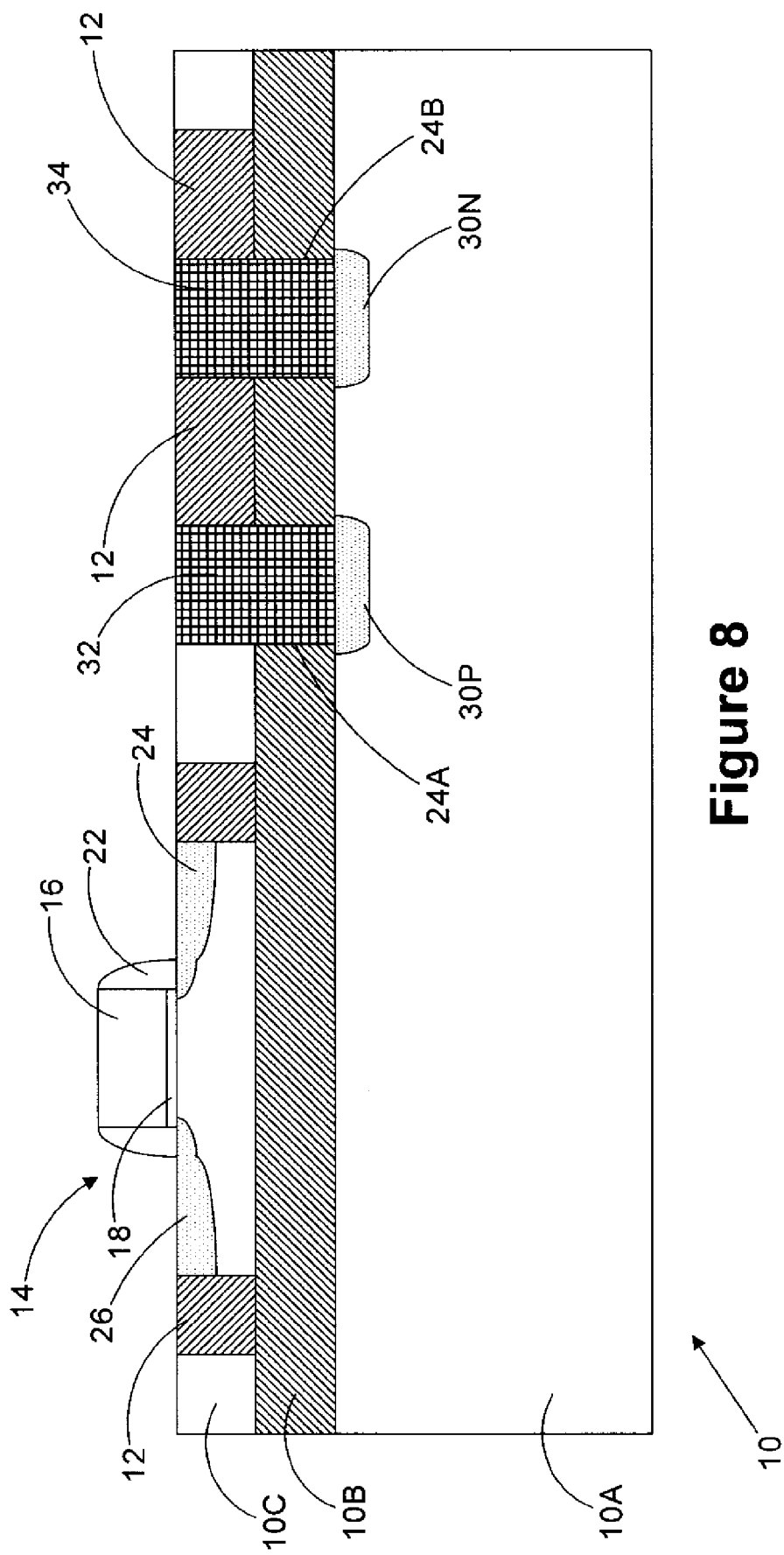

FIG. 8 shows the combined picture of processed transistor with the substrate contact 32 and 34. Various components of the illustrative transistor 14 may be formed in the active layer 10C of the SOI substrate 10. The manner in which these various structures of the transistor 14 are formed in very well known to those skilled in the art and will not be described in any great detail herein so as not to obscure the present invention. For example, the gate insulation layer 18 may be comprised of silicon dioxide, the gate electrode 16 may be comprised of polysilicon, and the source and drain regions 24, 26 (for an NMOS device) may be formed by performing one or more ion implantation processes to introduce N-type dopant material into the active layer 10C of the SOI substrate 10.

Thereafter, with reference to FIGS. 1 and 2, a conductive path may be established between the gate electrode 16 and the bulk substrate contact 34 and between the source region 24 and the bulk substrate contact 32 using a variety of known techniques. For example, the conductive contacts 40, 42, 50, 52 and conductive lines 44, 54 may be formed in layers of insulating material 60, 62 using a variety of known techniques. It should be understood that the illustrative conductive paths between the various structures on the device 100 are provided by way of example only as they may be created using a variety of techniques. To form the alternative embodiment depicted in FIG. 1A, the opening 24B would be filled with an insulating material 35, e.g., silicon dioxide. Thereafter, using known etching and photolithography techniques, an opening would be formed in the insulating material 35 and the conductive contact 42 could then be formed in that opening.

The present invention may be employed to drain stored charges from the gate electrode 16 and/or the body of the transistor 100. Due to capacitors and/or antenna charging (from conductive lines and contacts) attached to the transistor 100, charges, both positive (holes) and negative (electrons), may accumulate in the gate electrode 16 and/or in the body region of the transistor 100, i.e., the portion of the active layer 10C between the isolation structures 12 that isolate the transistor 100. The source region 24 of the transistor 100 is the ground node while the gate electrode 16 is the Vdd node. Accumulated charge in the body of the transistor 100 may dissipate or drain off to the P-doped bulk substrate 10A via the conductive path established by conductive contacts 50, 52, conductive line 54, and conductive bulk substrate contact 32. Accumulated charge on the gate electrode 16 may dissipate or drain off to the bulk substrate 10A via the conductive path established by the conductive contacts 40, 42, conductive line 44 and the conductive bulk substrate contact 34.

Generally, the present invention is directed to an SOI device with charging protection and methods of making same. In one illustrative embodiment, a device is formed on an SOI substrate comprising a bulk substrate, a buried insulation layer and an active layer. The device comprises a transistor formed in an isolated portion of the active layer, the transistor including a gate electrode and a source region. The device further comprises a first conductive bulk substrate contact extending through the active layer and the buried insulation layer, the first conductive bulk substrate contact being conductively coupled to the source region and the bulk substrate, and a second conductive bulk substrate contact extending through the active layer and the buried insulation layer, the second conductive bulk substrate being conductively coupled to the gate electrode and the bulk substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device formed on an SOI substrate comprising a bulk substrate, a buried insulation layer and an active layer, the device comprising:
    a transistor formed in an isolated portion of said active layer, said transistor comprising a gate electrode and a source region;
    a first conductive bulk substrate contact comprising a first conductive metal, said first conductive bulk substrate contact extending through said active layer and said buried insulation layer and being conductively coupled to said source region and said bulk substrate; and
    a second conductive bulk substrate contact comprising a second conductive metal different from said first conductive metal, said second conductive bulk substrate contact extending through said active layer and said buried insulation layer and being conductively coupled to said gate electrode and said bulk substrate.

2. The device of claim 1, wherein said transistor is an NMOS transistor.

3. The device of claim 1, wherein said transistor is a PMOS transistor.

4. The device of claim 1, wherein said active layer comprises silicon.

5. The device of claim 1, wherein said buried insulation layer comprises silicon dioxide.

6. The device of claim 1, wherein said first conductive metal comprises tungsten or polysilicon.

7. The device of claim 1, wherein said second conductive metal comprises tungsten or polysilicon.

8. The device of claim 1, wherein said first conductive bulk substrate contact is conductively coupled to said source region by a conductive line and a plurality of conductive contacts.

9. The device of claim 1, wherein said second conductive bulk substrate contact is conductively coupled to said gate electrode by a conductive line and a plurality of conductive contacts.

10. The device of claim 1, wherein said bulk substrate is doped with a P-type dopant material, and wherein the device further comprises a P-doped region formed in said bulk substrate, said P-doped region being in contact with said first conductive bulk substrate contact.

11. The device of claim 1, wherein said bulk substrate is doped with a P-type dopant material, and wherein the device further comprises an N-doped region formed in said bulk substrate, said N-doped region being in contact with said second conductive bulk substrate contact.

12. The device of claim 1, wherein stored charge in said portion of said active layer may be conducted away via a conductive flow path established between said source region and said first conductive bulk substrate contact.

13. The device of claim 1, wherein stored charge in said gate electrode may be conducted away via a conductive flow path established between said gate electrode and said second conductive bulk substrate contact.

14. A device formed on an SOI substrate comprising a bulk substrate, a buried insulation layer and an active layer, the device comprising:
   a transistor formed in an isolated portion of said active layer, said transistor comprising a gate electrode and a source region;
   a first conductive bulk substrate contact extending through said active layer and said buried insulation layer, said first conductive bulk substrate contact being conductively coupled to said bulk substrate;
   a first conductive flow path comprising at least one conductive line and a plurality of conductive contacts that conductively couples said first bulk substrate contact to said source region;
   a second conductive bulk substrate contact extending through said active layer and said buried insulation layer, said second conductive bulk substrate contact being conductively coupled to said bulk substrate; and
   a second conductive flow path that conductively couples said second bulk substrate contact to said gate electrode, wherein said first and second conductive flow paths are electrically isolated from one another.

15. The device of claim 14, wherein said first and second conductive bulk substrate contacts are comprised of a conductive metal.

16. The device of claim 14, wherein said first and second conductive bulk substrate contacts are comprised of different metals.

17. The device of claim 15, wherein said conductive metal comprises tungsten or polysilicon.

18. The device of claim 14, wherein said second conductive flow path comprises at least one conductive line and a plurality of conductive contacts.

19. The device of claim 14, wherein said bulk substrate is doped with a P-type dopant material, and wherein the device further comprises a P-doped region formed in said bulk substrate, said P-doped region being in contact with said first conductive bulk substrate contact.

20. The device of claim 14, wherein said bulk substrate is doped with a P-type dopant material, and wherein the device further comprises an N-doped region formed in said bulk substrate, said N-doped region being in contact with said second conductive bulk substrate contact.

21. The device of claim 14, wherein stored charge in said portion of said active layer may be conducted away via said first conductive flow path established between said source region and said first conductive bulk substrate contact.

22. The device of claim 14, wherein stored charge in said gate electrode may be conducted away via said conductive flow path established between said gate electrode and said second conductive bulk substrate contact.

23. A device formed on an SOI substrate comprising a bulk substrate, a buried insulation layer and an active layer, the device comprising:
   a transistor formed in an isolated portion of said active layer, said transistor comprising a gate electrode and a source region;
   a first conductive bulk substrate contact extending through said active layer and said buried insulation layer, wherein said first conductive bulk substrate contact is:
   conductively coupled to said bulk substrate and
   conductively coupled to said source region by a conductive line and a plurality of conductive contacts; and
   a second conductive bulk substrate contact extending through said active layer and said buried insulation layer, said second conductive bulk substrate contact being conductively coupled to said gate electrode and said bulk substrate.

24. A device formed on an SOI substrate comprising a bulk substrate, a buried insulation layer and an active layer, the device comprising:
   a transistor formed in an isolated portion of said active layer, said transistor comprising a gate electrode and a source region;
   a first conductive bulk substrate contact extending through said active layer and said buried insulation layer, said first conductive bulk substrate contact being conductively coupled to said source region and said bulk substrate; and
   a second conductive bulk substrate contact extending through said active layer and said buried insulation layer, wherein said second conductive bulk substrate contact is:
   conductively coupled to said bulk substrate and
   conductively coupled to said gate electrode by a conductive line and a plurality of conductive contacts.

25. A device formed on an SOI substrate comprising a bulk substrate doped with a P-type dopant material, a buried insulation layer and an active layer, the device comprising:
   a transistor formed in an isolated portion of said active layer, said transistor comprising a gate electrode and a source region;
   a P-doped region formed in said bulk substrate;
   a first conductive bulk substrate contact extending through said active layer and said buried insulation layer, said first conductive bulk substrate contact being conductively coupled to said source region and said P-doped region formed in said bulk substrate; and a second conductive bulk substrate contact extending through said active layer and said buried insulation layer, said second conductive bulk substrate contact being conductively coupled to said gate electrode and said bulk substrate.

26. A device formed on an SOI substrate comprising a bulk substrate doped with a P-type dopant material, a buried insulation layer and an active layer, the device comprising:

a transistor formed in an isolated portion of said active layer, said transistor comprising a gate electrode and a source region;

an N-doped region formed in said bulk substrate;

a first conductive bulk substrate contact extending through said active layer and said buried insulation layer, said first conductive bulk substrate contact being conductively coupled to said source region and said bulk substrate; and a second conductive bulk substrate contact extending through said active layer and said buried insulation layer, said second conductive bulk substrate contact being conductively coupled to said gate electrode and said N-doped region formed in said bulk substrate.

27. A device formed on an SOI substrate comprising a bulk substrate, a buried insulation layer and an active layer, the device comprising:

a transistor formed in an isolated portion of said active layer, said transistor comprising a gate electrode and a source region;

a first conductive bulk substrate contact comprising a first conductive metal, said first conductive bulk substrate contact extending through said active layer and said buried insulation layer and being conductively coupled to said bulk substrate;

a first conductive flow path that conductively couples said first bulk substrate contact to said source region;

a second conductive bulk substrate contact comprising a second conductive metal different from said first conductive metal, said second conductive bulk substrate contact extending through said active layer and said buried insulation layer and being conductively coupled to said bulk substrate; and a second conductive flow path that conductively couples said second bulk substrate contact to said gate electrode, wherein said first and second conductive flow paths are electrically isolated from one another.

28. A device formed on an SOI substrate comprising a bulk substrate, a buried insulation layer and an active layer, the device comprising:

a transistor formed in an isolated portion of said active layer, said transistor comprising a gate electrode and a source region;

a first conductive bulk substrate contact extending through said active layer and said buried insulation layer, said first conductive bulk substrate contact being conductively coupled to said bulk substrate;

a first conductive flow path that conductively couples said first bulk substrate contact to said source region;

a second conductive bulk substrate contact extending through said active layer and said buried insulation layer, said second conductive bulk substrate contact being conductively coupled to said bulk substrate; and a second conductive flow path comprising at least one conductive line and a plurality of conductive contacts that conductively couples said second bulk substrate contact to said gate electrode, wherein said first and second conductive flow paths are electrically isolated from one another.

29. A device formed on an SOI substrate comprising a bulk substrate doped with a P-type dopant material, a buried insulation layer and an active layer, the device comprising:

a transistor formed in an isolated portion of said active layer, said transistor comprising a gate electrode and a source region;

a P-doped region formed in said bulk substrate;

a first conductive bulk substrate contact extending through said active layer and said buried insulation layer, said first conductive bulk substrate contact being conductively coupled to said P-doped region formed in said bulk substrate;

a first conductive flow path that conductively couples said first bulk substrate contact to said source region;

a second conductive bulk substrate contact extending through said active layer and said buried insulation layer, said second conductive bulk substrate contact being conductively coupled to said bulk substrate; and a second conductive flow path that conductively couples said second bulk substrate contact to said gate electrode, wherein said first and second conductive flow paths are electrically isolated from one another.

30. A device formed on an SOI substrate comprising a bulk substrate doped with a P-type dopant material, a buried insulation layer and an active layer, the device comprising:

a transistor formed in an isolated portion of said active layer, said transistor comprising a gate electrode and a source region;

an N-doped region formed in said bulk substrate;

a first conductive bulk substrate contact extending through said active layer and said buried insulation layer, said first conductive bulk substrate contact being conductively coupled to said bulk substrate;

a first conductive flow path that conductively couples said first bulk substrate contact to said source region;

a second conductive bulk substrate contact extending through said active layer and said buried insulation layer, said second conductive bulk substrate contact being conductively coupled to said N-doped region formed in said bulk substrate; and a second conductive flow path that conductively couples said second bulk substrate contact to said gate electrode, wherein said first and second conductive flow paths are electrically isolated from one another.

* * * * *